(12) United States Patent
Nölscher et al.

(10) Patent No.: US 7,011,936 B2
(45) Date of Patent: Mar. 14, 2006

(54) PHOTOMASK AND METHOD OF STRUCTURING A PHOTORESIST BY DOUBLE EXPOSURE WITH IMAGING AUXILIARY STRUCTURES AND DIFFERENT EXPOSURE TOOLS

(75) Inventors: Christoph Nölscher, München (DE); Armin Semmler, München (DE); Günther Czech, Langebück (DE)

(73) Assignee: Infineon Technologies AG, Munich (DE)

( * ) Notice: Subject to any disclaimer, the term of this patent is extended or adjusted under 35 U.S.C. 154(b) by 295 days.

(21) Appl. No.: 10/331,641

(22) Filed: Dec. 30, 2002

(65) Prior Publication Data
US 2003/0143470 A1    Jul. 31, 2003

(30) Foreign Application Priority Data
Dec. 28, 2001   (DE)   ................................. 101 64 306

(51) Int. Cl.
*G03C 5/00*   (2006.01)

(52) U.S. Cl. ...................... 430/394; 430/311

(58) Field of Classification Search ................... 430/5, 430/311, 312, 313, 394
See application file for complete search history.

(56) References Cited

U.S. PATENT DOCUMENTS

| 5,242,770 A | 9/1993 | Chen et al. |
| 5,821,014 A | 10/1998 | Chen et al. |
| 6,514,648 B1 * | 2/2003 | Peng ........................... 430/30 |

* cited by examiner

*Primary Examiner*—Saleha R. Mohamedulla
(74) *Attorney, Agent, or Firm*—Laurence A. Greenberg; Werner H. Stemer; Ralph E. Locher

(57) ABSTRACT

A method for structuring photoresists and a corresponding photolithography mask utilize a principal structure and an auxiliary structure. In addition to the principal structure to be imaged, the photomask has an imaging auxiliary structure, which improves the imaging of the principal structure. The portions of the imaging auxiliary structure in the photoresist are exposed in a second exposure step and thereby likewise changed into a form that is soluble in a developer. Only the principal structure remains on the substrate after development.

12 Claims, 4 Drawing Sheets

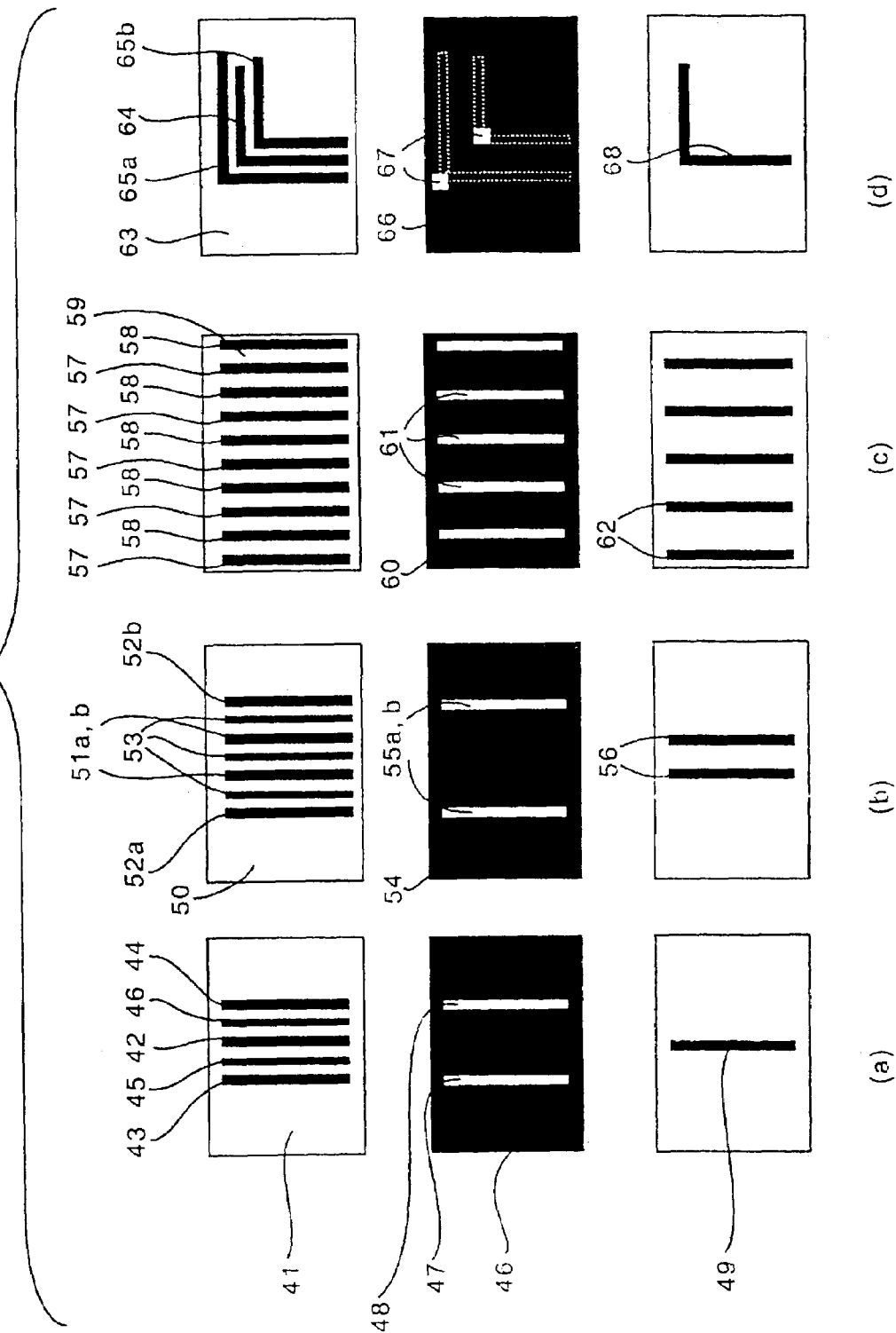

PHOTOMASK AND METHOD OF STRUCTURING A PHOTORESIST BY DOUBLE EXPOSURE WITH IMAGING AUXILIARY STRUCTURES AND DIFFERENT EXPOSURE TOOLS

BACKGROUND OF THE INVENTION

Field of the Invention

The invention lies in the photolithography field. Specifically, the invention relates to a method of structuring photoresists, and to a photomask that is suitable, in particular, for carrying out the method.

Commercial success in the semiconductor industry is substantially influenced by a further reduction in the minimal size of structure that can be represented on a microchip. A reduction in the minimal size of structure permits an increase in the computing speed of processors, and an increase in the storage capacity of memory chips. A substantial contribution to reducing the minimal size of structure is achieved by using radiation of ever shorter wavelength in optical lithography. At present, wavelengths of 248 nm (KrF laser) and 193 nm (ArF laser) are used for the industrial production of microchips that meet the highest requirements placed on computing speed and storage capacity. Methods which use even smaller wavelengths of 157 nm or 13 nm, respectively, are under development. For a given wavelength, the efficiency of the microchip can be further raised by optimizing the mask design, that is to say by arranging the structure elements as densely as possible, and by optimizing the exposure device.

The fabrication of a microchip may be summarized as follows: onto a silicon wafer, there is first applied a thin layer of photosensitive resist, a so-called photoresist. The resist layer is subsequently exposed with the aid of a photomask that is arranged in the beam path and contains all the information about the structure to be imaged. The photoresist experiences a chemical change upon exposure. For example, the polarity of the photoresist, and thus also its solubility in a polar developer, can change owing to the exposure. In the unexposed regions, by contrast, the photoresist remains unchanged and therefore insoluble in the developer. Thus, owing to the exposure there is a chemical modification of the photoresist, and therefore a differentiation between exposed and unexposed portions of the photoresist. If the exposed photoresist is now developed with the aid of a developer, the exposed portions of the photoresist are stripped away, while the unexposed portions remain on the wafer. Thus, trenches or depressions are produced at the bottom of which the wafer surface is exposed. The structure represented can now be transferred into the wafer, for example by etching, in order to produce depressions for the construction of a deep trench capacitor.

However, the trenches can also, for example, be filled with a conductive material in order in this way to produce conductor tracks. After further operating steps, if appropriate, the resist mask is removed again. The microchip is constructed in layers in this way.

The information required for structuring the photoresist is contained in the photomask, which is arranged in the beam path between the exposure source, generally a laser, and the photoresist. In the simplest case, the photomask corresponds to an image of the structure to be imaged, the regions to be exposed being transparent and the regions not to be exposed being covered by an absorber. Such a photomask is, for example, a COG mask (COG=Chrome On Glass).

The beam of the exposure radiation is diffracted at the transparent openings of the photomask such that secondary maxima are also always imaged on the photoresist in addition to the principal maximum. Since the intensity of the secondary maxima increases rapidly with rising order, it is generally only the first secondary maximum that need be taken into account. The intensity of the secondary maximum is mostly sufficiently small to effect no chemical change in the photoresist which leads to a stripping away of the photoresist during development. If, instead of an isolated structure, for example a line, two neighboring lines are then taken, the line maxima imaged in the photoresist influence one another reciprocally with decreasing spacing. If the spacing is further reduced, the intensities of neighboring secondary maxima finally add together such that, possibly, the intensity is sufficiently high to effect a chemical change in the photoresist such that the exposed portions of the secondary maxima are stripped away during development. In this case, the contrast between neighboring lines is thus no longer sufficient to achieve an acceptable imaging of the structure.

Near the resolution limit, only the principal maximum (zeroth order) and the 1st secondary maxima are imaged given vertical exposure of the photomask. In the case of a bright line, the line itself is imaged as principal maximum. The secondary maxima of 1st order (+1st and −1st order) are imaged on both sides of the line of the principal maximum. In order to improve the resolution, the photomask can be exposed obliquely, which means that the exposure source can be swiveled from the surface normal. After traversing the photomask at an oblique angle the light beam strikes the surface of the photoresist, for which reason now only one of the secondary maxima is imaged, while the other is no longer focused on the surface.

In order to improve the contrast and the depth of field of the structures to be imaged, photomasks have also been developed in the case of which the phase ratios between neighboring imaged structures are influenced specifically. For this purpose, a line in a second plane of the photomask in the transparent regions of neighboring lines is respectively provided with a phase shifter by way of which the direction of the electric field of a perpendicularly incident plane wave is inverted. The phase of the light impinging on the photoresist is therefore phase-shifted by 180° between neighboring lines. As a consequence of destructive interference, the intensity of the secondary maximum arranged between the neighboring principal maxima therefore decreases, or the secondary maximum is erased in the case of ideal conditions. Consequently, the contrast between the imaged neighboring lines is increased. A precondition for the phase mask effect is that the spacing between the openings is so small that the diffraction figures overlap. This is significant only for spacings in the range of ≦ of the limiting resolution. Photomasks in the case of which, starting from conventional masks, neighboring mask openings are alternately either provided with a phase shifter or not provided with one are denoted as alternating phase shift masks (altPSM). Thus, what remains as a basis is a conventional mask with non-transparent regions. The bright/dark mask structures and the structures to be produced in the photoresist are similar to one another.

A reduction in the width of absorbing structures on the altPSM leads to intensified interference effects. In the extreme case, the openings on the mask are not separated by absorbers. The remaining phase jump of 180°, that is to say the zero crossing of the amplitude of the electric field, is imaged as a fine dark line. The intensity distribution of this line is approximately half as wide as can be imaged with the aid of a conventional COG mask. If the phase jump is designed as a meander, it is then also possible to produce wider lines as long as the meander structure is finer than the limiting resolution of the lens of the exposure device.

A further class of phase shift masks are the so-called halftone phase shift masks (HTPSM). These are masks with uniformly partially transmitting absorbers, the light that traverses the fully transparent regions emerging with a phase differing by 180° from the mask as light that traverses the semitransparent regions. Imaging is achieved by virtue of the fact that the halftone regions absorb exactly so much light that no marked chemical change occurs in the photoresist. Here, the phase jump also forces a zero crossing of the light amplitude and destructive interference of unsharply imaged light in the edge region.

If the electric field strength changes its sign owing to a phase shifter at every other (every $2^{nd}$) opening, the fundamental frequency of the spatial electric field distribution is half as large as the fundamental frequency of the light intensity in the case of a Fourier decomposition. This doubling of the spatial frequency, which is evidenced as imaged intensity in the photoresist and effects an improvement in the resolution up to at most a factor of 2, leads to the class of the frequency-doubling phase shift masks, which includes the alternating and the chromeless alternating PSMs. The electric field distribution in the case of halftone phase masks does not lead in the periodic grating to a spatial frequency doubling of the intensity and thus also not to a correspondingly large improvement in the resolution, but to an improvement in the edge contrast, because of the zero crossing of the intensity forced by the phase jump.

The spacing between neighboring structures influences not only the intensity of the secondary maximum arranged between two bright lines, but also the width of the principal maximum or the slope of the edges of the principal maximum. If an isolated line is imaged on the photoresist, its principal maximum has a specific width and a specific slope. If the spacing from a neighboring line is now reduced, not only do the secondary maxima of the lines interfere, as described above, but the principal maximum of the first line also interferes with the secondary maximum of the other line. In consequence, the width of the principal maximum decreases and the slope of the edges of the principal maximum increases. Structures whose spacing corresponds to the resolution limit of the lens of the exposure device are denoted as dense structures. In the case of these dense structures, the exposed and unexposed regions, which later correspond to the trenches or ribs in the developed photoresist, have the minimum possible width. The sum of the widths of exposed and neighboring unexposed regions is denoted as pitch. In the case of dense structures, the effect of the increase in edge slope or of the reduction in the line width is most pronounced. Consequently, when designing the photomask an attempt is made to arrange all the elements of the microchip such that as far as possible only dense structures are obtained. However, this is not always possible, and so in addition to the dense structures it is always also necessary to accept isolated structures as well as a transition region of so-called semidense structures where the influence of neighboring structures, although noticeable, is not so pronounced as with dense structures.

In order in the case of isolated structures, as well, to obtain principal maxima with steep edges and a comparable width as in the case of dense structures, U.S. Pat. No. 5,242,770 has proposed to arrange, in addition to the isolated structures to be imaged, auxiliary structures which have dimensions that are below the resolution limit of the exposure device used and are therefore not imaged on the photoresist. These non-imaging structures interfere with the principal maximum of the imaging structure, and therefore increase the edge slope and, finally, lead to a steeper edge of the trenches produced in the photoresist. This also holds for dark principal structures, the edge of the light intensity at the principal structures being steepened by secondary maxima. The effect is dependent on the width of the non-imaging auxiliary structures. In this patent, the optimal width of the non-imaging auxiliary structures was determined empirically, and corresponds to approximately one fifth of the minimal size of structure. The maximum permissible width of the non-imaging auxiliary structures was determined empirically at approximately one third of the wavelength of the radiation used for the exposure. In order to obtain the desired instances of interference, the non-imaging structures must be arranged at a specific spacing from the imaging structure, which is determined, for example, by the width of the imaging structure and the wavelength used. The optimal spacing between imaging and non-imaging structures was determined empirically and is approximately 1.1 times the minimal size of structure. Consequently, the arrangement of neighboring structures is subject to strict rules with reference to its spacing. This leads to restrictions in the photomask design in the case of semidense structures. It is possible to arrange between two neighboring imaging structures a non-imaging structure that in each case adopts a specific spacing from the neighboring imaging structures. If the spacing is increased, two non-imaging auxiliary structures can be arranged between neighboring imaging structures only when, on the one hand, imaging and non-imaging structures are arranged at a specific spacing from one another, and the spacing between the two non-imaging structures likewise does not undershoot a specific minimal spacing, since otherwise the non-imaging structures begin to be imaged on the photoresist.

In order to overcome these strict spacing rules, and also to obtain greater freedom in designing semidense structures, without having to dispense with the effect of a steepening of the edges, it has been proposed in U.S. Pat. No. 5,821,014 to permit specific deviations in the spacing between imaging and non-imaging or between two non-imaging structures. The minimal spacing between imaging and non-imaging structures or between two non-imaging structures is dependent in this case on the wavelength of the radiation used for the exposure, and can be reduced down to 75% of the wavelength. Furthermore, changes are also permitted in the width of imaging and non-imaging structures. Depending on the spacing between neighboring structures, semidense structures more readily resemble dense structures or isolated structures. The semidense structure is approximated as close as possible to a dense structure by a variation in line width of the non-imaging auxiliary structure, in the spacing between imaging structure and non-imaging structure, and in the line width of the imaging structure. In this case, there are respectively defined for the variation in the abovenamed parameters regions with wherein as good a compromise as possible must be found. The use of non-imaging halftone auxiliary structures is described as a further possibility. In this case, although the non-imaging auxiliary structures have the optimal width determined empirically or by simulation, they are fashioned not as continuous lines but as interrupted ones. The effective width of the non-imaging auxiliary structure can then be reduced by means of the stroke length and the spacing between the strokes.

It is true that the imaging of semidense structures can be improved by the method described in U.S. Pat. No. 5,821,014, but it is mostly necessary in the transition region, in the case of spacings that permit precisely only one non-imaging auxiliary structure between the imaging principal structures, to define forbidden zones in the design, since only small process windows are possible for these spaces, that is to say only very small fluctuations can be permitted in order to achieve the desired effects.

SUMMARY OF THE INVENTION

It is accordingly an object of the invention to provide a method of structuring photoresists and a photolithography mask, which overcome the above-mentioned disadvantages of the heretofore-known devices and methods of this general type and which renders possible, in the structuring of photoresists, to image semidense structures with an imaging quality comparable to that of dense structures.

With the foregoing and other objects in view there is provided, in accordance with the invention, a method of structuring a photoresist. The method comprises:

providing a photoresist on a substrate;

performing a first exposure by exposing the photoresist with a first photomask imaging a principal structure and an imaging auxiliary structure, for improved imaging of the principal structure, onto the photoresist to thereby cause a chemical differentiation of the photoresist between exposed and unexposed regions; and subsequently performing a second exposure with a second photomask imaging the imaging auxiliary structure on the photoresist but not imaging the principal structure on the photoresist to thereby cause a chemical modification of the photoresist only in imaged portions of the imaging auxiliary structure; and developing the photoresist with a developer such that only the principal structure is retained on the substrate.

With the above and other objects in view there is also provided, in accordance with the invention, a photomask with a principal structure, and an imaging auxiliary structure spaced apart from the principal structure.

In other words, the objects of the invention are achieved with the aid of a method for structuring photoresists, wherein a photoresist is prepared on a substrate and a first exposure is carried out, wherein the photoresist is exposed with the aid of a first photomask that images a principal structure and an imaging auxiliary structure, which improves the image of the principal structure, onto the photoresist such that a chemical differentiation of the photoresist takes place between exposed and unexposed regions, and subsequently a second exposure is carried out with the aid of a second photomask that images the imaging auxiliary structure on the photoresist and does not image the principal structure on the photoresist such that a chemical modification of the photoresist takes place only in the imaged portions of the imaging auxiliary structure, and the photoresist is developed with the aid of a developer such that only the principal structure is retained on the substrate.

By contrast with the above-described methods, wherein only non-imaging structures are permitted as auxiliary structures, in the case of the method according to the invention imaging structures are also permitted which are then removed with the aid of a second exposure or are converted into a form that is soluble in a developer. The method according to the invention therefore improves principally the imaging of semidense structures in the case of which the spacing between neighboring imaging principal structures is so large that in accordance with the above-described methods a non-imaging structure can be arranged between the principal structures, but the spacing is still not so large that a second non-imaging auxiliary structure also finds room. Proceeding from the method proposed in U.S. Pat. No. 5,242,770, in the case of semidense structures the width of the non-imaging auxiliary structure arranged between the imaging principal structures is thus enlarged so far that the optimal spacing between principal and auxiliary structures is reserved in each case, the non-imaging auxiliary structure merging into an imaging auxiliary structure. The optimal design is determined in this case by means of simulation tools such that a good CD control is achieved in the imaging (CD=Critical Dimension). There is thus no need in the case of semidense structures to compromise with regard to the spacings and the line widths of imaging and non-imaging structures in order to achieve an edge steepness that corresponds approximately to the edge steepness of dense structures; instead, the optimal slope of the edge is always obtained. In other words, in the case of the method according to the invention the semidense principal structure is thus supplemented by an imaging auxiliary structure to form a dense structure, the imaging auxiliary structures being removed with the aid of a second exposure step after the imaging in the photoresist.

If use is made of a positive, chemically amplified photoresist, the method according to the invention is carried out in such a way that firstly a layer of the photoresist is applied to a wafer, with the possibility of electronic components already having been integrated in the wafer in preceding process steps. The wafer provided with the photoresist is then transferred into an exposure device, and there is arranged in the beam path between the exposure source and photoresist a photomask which comprises a dark imaging principal structure and a dark imaging auxiliary structure. During exposure, the regions, corresponding to the principal structure and the imaging auxiliary structure, on the photoresist are shaded and are therefore not exposed. The photoresist remains unchanged in these portions. In the other regions, in particular in the portions between principal and imaging auxiliary structure, the radiation strikes the photoresist and effects a change there in the structure or the composition of the photoresist. For example, acid can be released in the exposed regions from a photoacid generator contained in the photoresist. The exposed regions of the photoresist thus contain acid, while the unexposed regions remain acid free. A chemical differentiation has thus taken place between exposed and unexposed portions. In the case of the second exposure, a second photomask is arranged in the beam path between the exposure source and photoresist, in the case of the second photomask the regions corresponding to the imaging auxiliary structure being transparent and the regions corresponding to the principal structure being opaque. The size of the mask and dose used in the second exposure can be determined by simulation or experimentally. It is advantageous to use a photomask wherein only the regions corresponding to the auxiliary structure are transparent, since faulty exposures caused by scattering effects are then reduced. However, it is also possible in principle to use a photomask wherein only the regions corresponding to the principal structure are opaque. A safety spacing is suitably provided in this case such that the regions which correspond to the principal structure are not exposed to scattered light. During the second exposure, acid is now also released from the photo acid generator in the portions of the auxiliary structure such that the chemical differentiation between the portions exposed in the first exposure step and the portions of the imaging auxiliary structure is lost. There thus now remains only a chemical differentiation between the further unexposed portions of the principal structure and the remaining portions of the photoresist. It therefore follows that only the principal structure remains on the wafer in the case of a development. After the exposure, a baking step is firstly carried out (PEB, Post Exposure Bake) wherein the photoresist is converted into a polar form in the exposed regions with acid catalysis. It is possible either not to carry out the PEB step until after the second exposure, or preferably to carry out a first PEB step after the first exposure and a second PEB step after the second exposure. The risk of contamination of the photoresist by basic compounds during the standing time between first and second exposure, by means of which the released acid can be neutralized, is reduced in this way. A longer period is therefore available for the second exposure. The photoresist is developed in a way known per se after the PEB step. For this purpose, the now polar portions of the photoresist are stripped away from the wafer with the aid of a polar basic developer such that only the principal structure remains as raised portions on the wafer. Further processing of the wafer is subsequently performed in a way known per se.

In order to avoid faulty exposures during the second exposure, the first exposure and the second exposure are preferably carried out under different conditions. Faulty exposures are understood here as an exposure of those sections on the photoresist that correspond to the principal structure and are also intended to remain unchanged during the second exposure. Such a faulty exposure can take place, for example, owing to secondary maxima of the imaged auxiliary structure. The conditions for the secondary exposure are therefore selected such that as far as possible the edges of the principal structure are not exposed or are exposed only slightly. The first and the second exposure can, for example, be carried out for this purpose with the aid of exposure devices that have different resolving powers. The different conditions are fashioned for this purpose such that the first exposure is carried out with the aid of a first exposure device, and the second exposure is carried out with the aid of a second exposure device, first and second exposure devices having a different numerical aperture.

The second exposure is preferably carried out with a lower resolution. For this purpose, the first exposure device has a larger numerical aperture than the second exposure device. In this case, the first and second exposures will preferably be carried out with the aid of radiation of the same wavelength. This has the commercial advantage that it is possible to use more favorable exposure devices for the second exposure, for example steppers with a lower resolution for the same wavelength. However, the second exposure can also be carried out with a radiation that has a longer wavelength than the radiation used in the first exposure. Thus, for example, DUV scanners (DUV=Deep Ultra Violet) can be used for the second exposure in conjunction with 193 nm scanners for the first exposure.

The second exposure can also be carried out in such a way that the different conditions are fashioned such that the first exposure is carried out with the aid of a radiation that has a wavelength different from the radiation used in the second exposure. Since diffraction effects and thus the position of the secondary maxima depend on the wavelength, the exposure conditions can be influenced by selecting the wavelength used in the case of the second exposure. With this embodiment, the photoresist is preferably fashioned such that it is sensitive to both wavelengths. This can be achieved, for example, by using various photo acid generators that are sensitive in each case to at least one of the wavelengths used.

The radiation used for the first exposure preferably has a shorter wavelength than the radiation used for the second exposure.

The different conditions can also be configured such that the first photomask and the second photomask have a different mask type. For this purpose, the first exposure can be carried out, for example, with the aid of an alternating phase shift mask, and the second exposure can be carried out with the aid of a conventional COG mask or an alternating phase shift mask. The different mask types vary in their imaging behavior and/or in the position of the secondary maxima.

The mask type is preferably selected from the group that is formed from chrome masks (COG), halftone phase shift masks (HTPSM) and alternating phase shift masks (altPSM). This holds both for the first exposure and for the second one. If different mask types are used for the first and second exposures, the sequence wherein a particular mask type is first used is not subject to any restrictions. Thus, the first exposure can be carried out with the aid of an HTPS mask and the second exposure with the aid of a COG mask. However, it is likewise possible to carry out the first exposure with the aid of a COG mask and the second exposure with the aid of an HTPS mask.

In the case of the first exposure, the exposure is preferably carried out by oblique exposure since it is thereby possible to achieve a further improvement in resolution. Depending on the geometry of the structure to be imaged, the second exposure is performed in a circular, annular or quadrupolar fashion.

In order to reduce standing time effects, it is also possible as early as after the first exposure to perform an intermediate development of the photoresist with the aid of a developer such that the principal structure and auxiliary structure remain on the substrate. In the case of this embodiment, after the first exposure a PEB step is preferably firstly carried out and the photoresist is subsequently developed with the aid of a developer. The second exposure is then performed with the aid of a subsequent PEB step and development of the principal structure. In this way, the photoresist can be left for a lengthy time between the first and second exposures without resulting in a worsening of the structure produced.

The method according to the invention uses imaging auxiliary structures for the purpose of structuring the photoresist. The subject matter of the invention is therefore also a photomask having a principal structure and an imaging auxiliary structure arranged spaced apart from the principal structure. The mask permits imaging of semidense principal structures as well, steepening of the edges of the main structure and/or enlargement of the process window being achieved during the imaging, which is comparable with dense structures.

If the principal structure has dense, semidense and isolated portions, the imaging auxiliary structure is preferably arranged such that the semidense and/or the isolated portions of the principal structure are at least partially supplemented to form dense structures. Depending on the structure, use is made of imaging auxiliary structures, non-imaging auxiliary structures or no auxiliary structures.

In the case of the structuring of a photoresist, the imaging auxiliary structure is converted in a second exposure step into a form that can be stripped away. In this case, the edges of the principal structure are intended not to be exposed, or at least exposed as little as possible. Consequently, the spacing between principal structure and imaging auxiliary structure is preferably selected such that during a first exposure under a first exposure condition imaging of the principal structure and the imaging auxiliary structure onto the photoresist takes place, and the principal structure imaged in the photoresist is essentially not exposed during a subsequent second exposure, carried out under a second exposure condition, differing from the first exposure condition, with a second photomask by which the imaging auxiliary structures are imaged.

In individual cases, it can be favorable to supplement the imaging auxiliary structure by a non-imaging auxiliary structure in order to enlarge the spacing between principal and imaging auxiliary structures and to achieve a larger process window. This holds, for example, for isolated line structures.

It is preferred in this case to arrange the non-imaging auxiliary structure between the principal structure and imaging auxiliary structure.

The photomask per se can be of any desired configuration. The photomask, in the currently preferred exemplary implementations, is a mask type which is selected from the group that is formed from chrome masks (COG), halftone phase shift masks (HTPSM), and alternating phase shift masks (altPSM).

Other features which are considered as characteristic for the invention are set forth in the appended claims.

Although the invention is illustrated and described herein as embodied in a double exposure with imaging auxiliary structures and various exposure tools, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 are various plan views of photomasks that are suitable for carrying out the method according to the invention, and the associated structures in the photoresist.

DESCRIPTION OF THE PREFERRED EMBODIMENTS

Figure 1A:
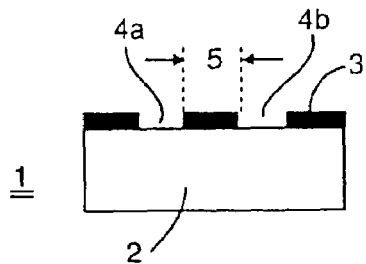
FIG. 1A is a schematic side view of a conventional COG mask.
Figure 1B:
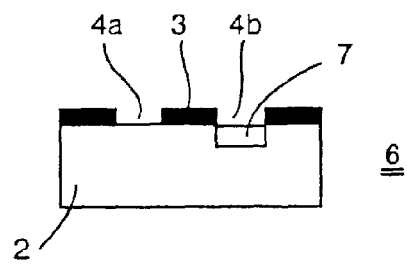
FIG. 1B is a schematic side view of an alternating phase shift mask.

Referring now to the figures of the drawing in detail and first, particularly, to FIGS. 1A to 1D thereof, there is shown the phase of the electric field and the intensity distribution of the light incident on a photoresist for a conventional and an alternating phase shift mask. In the case of a conventional mask 1, for example a COG mask (FIG. 1A), there are arranged on a transparent substrate 2 absorbers 3 that define the opaque portions of the photomask 1 and between which transparent portions 4a, 4b are preserved. The absorbing portion 3 in this case has a width 5 such that the portions 4a, 4b are still just capable of being resolved by the lens. An alternating phase mask 6 illustrated in FIG. 1B has a comparable design to a conventional mask 1. However, there is provided, in addition, a phase shifter 7 in every other transparent section 4b. The phase shifter 7 shifts the phase by 180° as compared to the light traversing the transparent portion 4a.

Figure 1C:
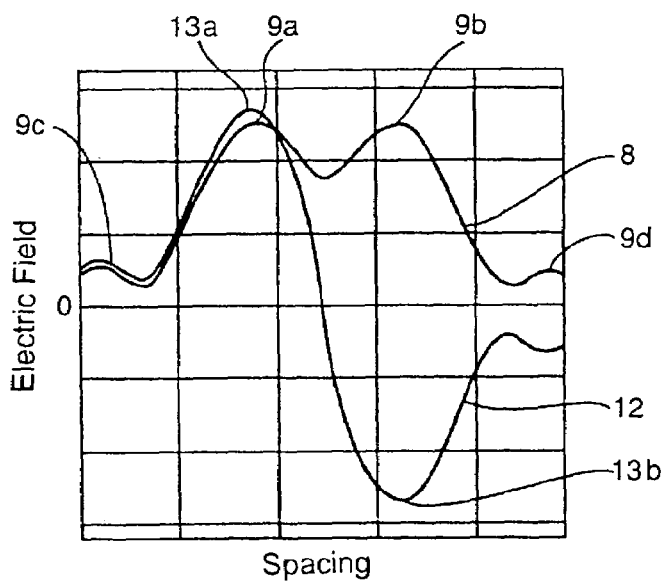
FIG. 1C is a graph plotting curves, associated with the masks of FIGS. 1A and 1B, of the phase of the electric field.
Figure 1D:
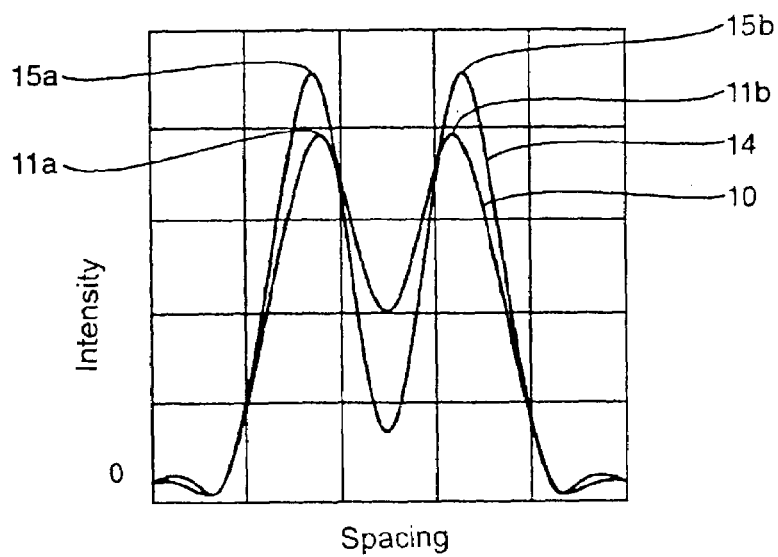
FIG. 1D is a graph plotting curves, associated with the masks of FIGS. 1A and 1B, of the distribution of the imaged intensity.

The phase of the electric field and the imaged light intensity are illustrated in FIGS. 1C and 1D for the two masks. The curve 8 is obtained for the electric field in the case of the conventional photomask 1. The phase of the electric field is the same in each case for the light traversing the transparent regions 4a, b. In addition to the principal maxima 9a, b, interference results in the formation of two secondary maxima in each case, of which the outer secondary maxima 9c, 9d are imaged separately from the principal maximum 9a or 9b, respectively. The respective other secondary maxima are arranged near the principal maxima 9a, 9b. The edges of the principal maxima add together in the intermediate region. This leads to a worsening of the contrast in the case of the imaged intensity. In the curve 10 illustrated in FIG. 1D, which represents the distribution of the light intensity, the light intensity does not drop sufficiently far between the principal maxima 11a, 11b to preserve a clear contrast between the imaged structures. Given the use of a phase shift mask 6, the vectors of the electric field of the light traversing the transparent regions 4a, 4b are shifted relative to one another by 180°. In the curve 12, illustrated in FIG. 1C, of the electric field, the principal maxima 13a, 13b therefore exhibit opposing signs and the secondary maxima arranged between the principal maxima 13a, 13b are erased by destructive interference. A zero crossing of the electric field takes place between the principal maxima 13a, 13b. In the case of the imaged intensity (FIG. 1D, curve 14), a clear intensity reversal therefore results between the principal maxima 15a, 15b, and thus an improved contrast by comparison with the intensity curve 10 of the conventional mask 1.

Figure 2A:
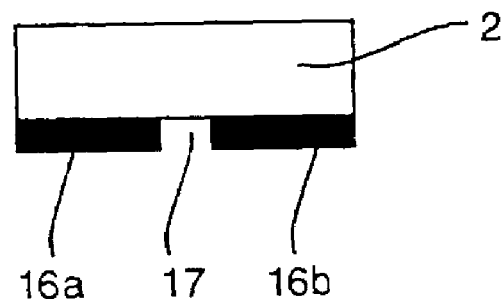
FIG. 2A is a schematic side view of a halftone phase shift mask.
Figure 2B:
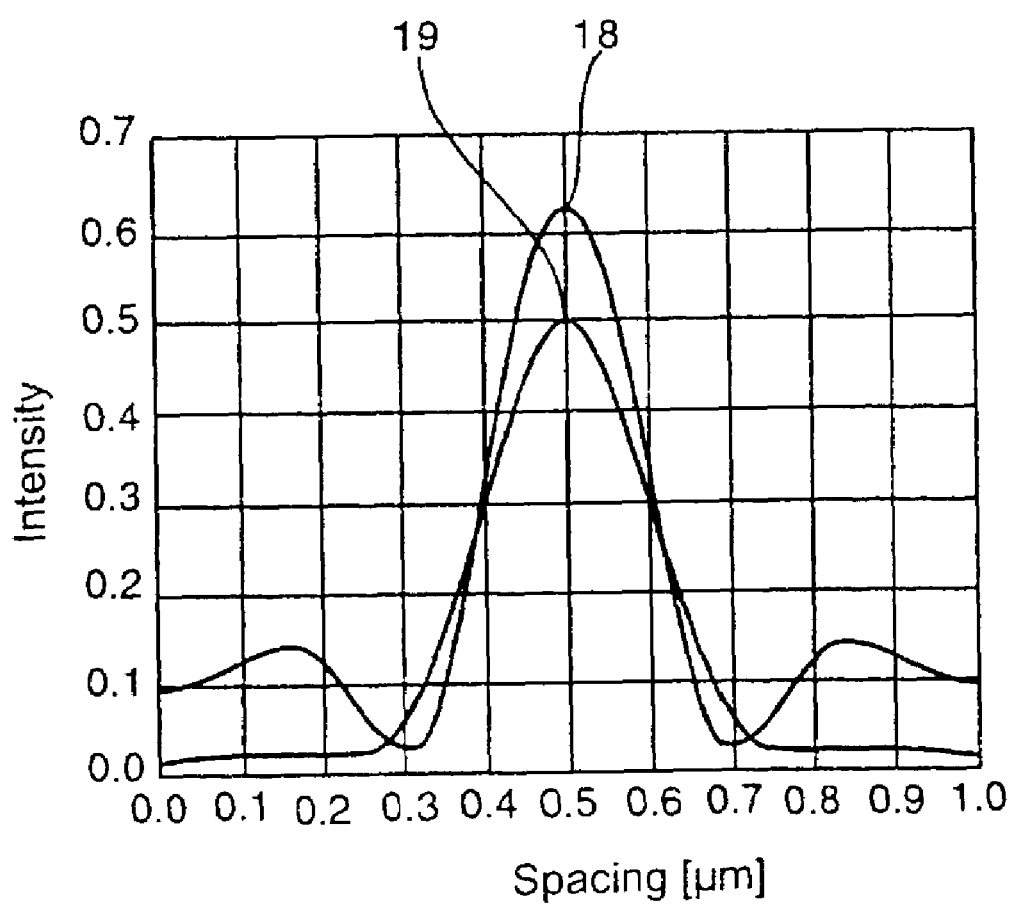
FIG. 2B is a graph plotting the distribution of the imaged intensity by comparison with a conventional COG mask.

The intensity distribution for an isolated line is illustrated in FIG. 2 for a halftone phase shift mask and, by comparison, for a conventional mask. The structure of a phase shift mask is illustrated in FIG. 2A. Absorbers 16a and 16b are mounted on a substrate 2. The absorbers 16a and 16b have a low transparency relative to the light used for the exposure. The electric field of the light passing through the absorber 16a, 16b is phase shifted by 180° relative to the electric field of the light passing through the transparent portion 17. A phase jump is thereby forced at the transition between the absorber 16 and transparent portion 17. This means, in the distribution of the intensity of the imaged light, that the principal maximum 18 of the image produced with the aid of the HTPSM is narrower and has steeper edges than the principal maximum 19 that was produced with the aid of a conventional mask.

Figure 3:
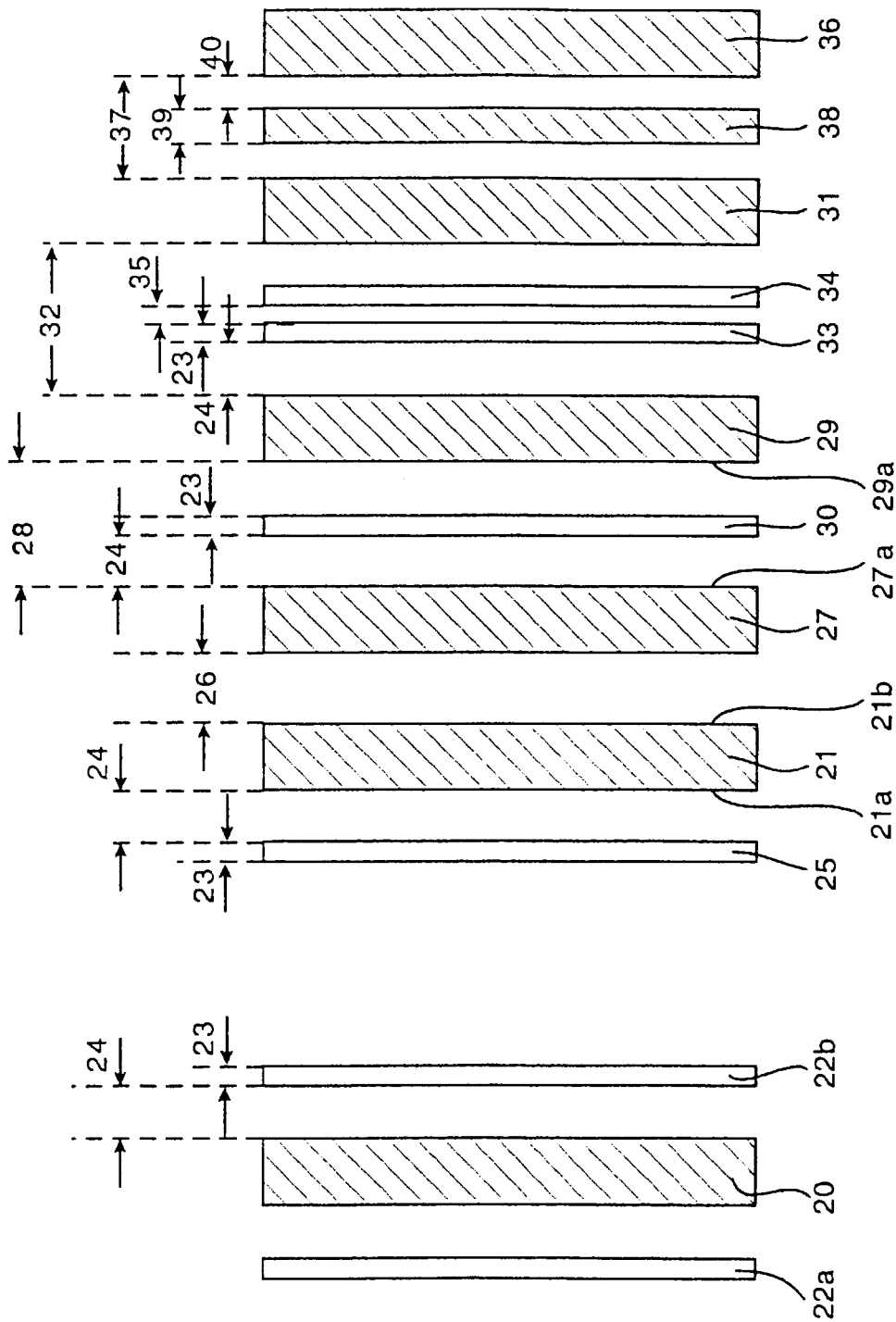
FIG. 3 is a plan view illustrating the layout of imaging and non-imaging lines on a photomask.

Neighboring structures influence the distribution of the intensity of the imaged structures. In this case, isolated structures exhibit a wider intensity distribution than dense structures. The intensity distribution, that is to say the slope of the edge of the principal maximum, can be influenced by auxiliary structures. Various possibilities for the arrangement are illustrated in FIG. 3.

The line 20 corresponds to an isolated imaging dark structure. It is arranged at a spacing from the neighboring line 21 such that no interaction is observed when the line 20 is imaged on a photoresist. Auxiliary lines 22a, 22b are arranged on both sides of the line 20 in order to improve the edge steepness and the process window. The lines 22a, 22b have a specific line width 23 that is below the resolving limit of the lens, and a specific spacing 24 from the line 20. The line width 23 and the spacing 24 are determined empirically and are selected such that the steepness of the edges, the width of the imaged line 20 and the processor window are optimized for the imaging.

On one side, the line 21 has an edge 21a that forms an isolated structure. In order to improve the imaging, there is arranged adjacent to the edge 21a a non-imaging auxiliary line 25 that, like the non-imaging auxiliary lines 22a, 22b, has a specific line width 23 and a specific spacing 24 from the imaging line 21. The line widths 23 and the spacings 24 from the imaging line are selected to be equal in each case for the non-imaging auxiliary lines 22a, 22b and 25. The edge 21b, opposite the edge 21a, of the imaging line 21 corresponds to a dense structure, that is to say the spacing 26 from the neighboring line 27 is selected such that the images in the two lines interfere, and thus a steepening of the edges or a reduction in the line width is observed.

The spacing 28 of the lines 27 and 29 is so large that only a slight interference between the images of the neighboring lines is to be observed. The lines 27 and 29 therefore form a semidense structure. An auxiliary line 30 is arranged between the lines 27 and 29 in order to achieve a steepening of the edges 27a and 29a in the image. Like the non-imaging auxiliary lines 22a, 22b and 25, the auxiliary line 30 has a specific line width 23 and a specific spacing 24 from the neighboring edges 27a and 29a. However, the spacing 28 between the imaging lines 27 and 29 is also fixed thereby. If the spacing between the imaging lines is further increased, an organization is reached that corresponds to the imaging lines 29 and 31. The imaging lines 29 and 31 have a spacing 32. Auxiliary lines 33 and 34 are arranged between the imaging lines 29 and 31 in order to achieve a steepening of the edges or a narrow line width. The non-imaging auxiliary lines 33 and 34 in turn have a specific line width 23 and a specific spacing 24 from the imaging lines 29 and 31. Furthermore, the non-imaging auxiliary lines 33 and 34 must have a specific minimum spacing 35 in order not to be imaged. It follows from this that the spacing 32 also must not undershoot a specific value which results from the sum of the line widths 23 and the spacings 24 and 35, respectively. Consequently the result for the spacing between neighboring imaging lines is forbidden zones wherein no imaging lines may be positioned, since the process window is too small.

The imaging lines 31 and 36 have a spacing 37 that corresponds to such a forbidden zone. In order, nevertheless, to be able to image the lines with steep edges and a small line width, an imaging auxiliary line 38 is arranged between the imaging lines 31 and 36. The imaging auxiliary line 38 has a line width 39 that is greater than the line width 23 of the non-imaging auxiliary lines 30, 33 and 34. The spacing 40 between the imaging auxiliary line 38 and the edges of the imaging lines 31 and 36 is selected such that it is possible to achieve an optimal steepening of the edges and a small line width.

The cycle of the method according to the invention is illustrated in FIG. 4 with the aid of the photomasks used and the resist structure obtained for four different structures (partial views (a) to (d)). In this case, the uppermost row in each case illustrates the photomask for the first exposure, the middle row illustrates the photomask for the second exposure, and the lower row illustrates the resist structure obtained. The illustration of the transparent portions of the photomasks is bright, that of the light-absorbing portions is dark.

The partial view (a) shows the cycle for producing an isolated line. The first photomask 41 has as principal structure an imaging line 42 to either side of which an imaging auxiliary line 43, 44 is arranged. Non-imaging auxiliary lines 45, 46 are respectively arranged between the imaging line 42 and the imaging auxiliary lines 43 and 44 for the purpose of enlarging the spacing. Upon exposure with the aid of a first wavelength, the imaging lines 42, 43 and 44 are therefore imaged on the photoresist. The second photomask 46 comprises only the transparent portions 47 and 48 corresponding to the imaging auxiliary lines 43, 44, while the remaining regions of the second photomask 46 are opaque. During the second exposure, which is executed with the aid of a wavelength differing from the first exposure, the portions of the photoresist that correspond to the imaging lines 43 and 44 are therefore now also exposed and thereby converted into a soluble form. After the development, the result is an isolated line 49 that has an edge steepness which corresponds to a dense structure.

The cycle for the imaging of a double line is illustrated in the partial view (b). The first photomask 50 comprises two principal lines 51a, b that are flanked by in each case one imaging auxiliary line 52a and 52b, respectively. Non-imaging auxiliary lines 53 are respectively arranged between the principal lines 51a, b and between principal lines 51a, b and imaging auxiliary lines 52a, b. Thus, upon exposure the portions corresponding to the principal lines 51a, b and the imaging auxiliary lines 52a, b are exposed on the photoresist. Use is made for the second exposure of the second photomask 54, which has transparent portions 55a, b that correspond to the portions of the imaging auxiliary lines 52a, b. A double line 56 is obtained after the development.

Partial view (c) shows the production of a grating in the case of which the lines have a spacing that is normally forbidden, since there is just no longer room for two non-imaging auxiliary lines between the grating lines.

The first photomask 59 comprises as principal structure imaging lines 57 that have a spacing which is dimensioned such that two non-imaging auxiliary lines just no longer fit in, whereas a single non-imaging line no longer results in a marked improvement in the edge steepness and the line width. In this case, imaging auxiliary lines 58 are arranged between the imaging principal lines 57. The imaging auxiliary lines 58 have a line width resulting in a spacing from the edges of the principal lines that leads to the optimum steepening of the edges. In the case of the first exposure step, both the imaging lines 57 of the principal structure and the imaging lines of the auxiliary structure 58 are imaged on the photoresist. The second exposure is carried out with the aid of a second photomask 60, which has transparent portions 61 that correspond to the auxiliary lines 58 of the first photomask 59. Consequently, in the second exposure step the portions corresponding to the auxiliary lines 58 are likewise exposed, while the principal lines 57 continue to remain unexposed. Thus, after development only the portions 62 of the photoresist that correspond to the principal lines 57 remain as raised regions.

The cycle for the representation of a rectangular structure is illustrated in the partial view (d) of FIG. 4. Here, the first photomask 63 comprises as principal structure an imaging rectangular line 64 that is flanked by two auxiliary lines 65a, b. The auxiliary lines 65a, b have a line width that does not image them, except for the corner point. During the first exposure step, the principal line 64 and the corner region of the auxiliary lines 65a, b are therefore imaged on the photoresist. In the second exposure step, the portions corresponding to the corner points of the auxiliary lines 65a, b are now also exposed on the photoresist. Provided for this purpose in the second photomask 66 are transparent portions 67 that correspond to the corner points of the auxiliary lines 65a, b. The regions corresponding to the auxiliary lines 65a, b are illustrated by dashes on the second photomask 66 for the purpose of better understanding. Consequently, a rectangular line 68 remains as a raised portion after the development of the exposed photoresist.

EXAMPLES

The first step was to coat silicon wafers with a layer of thickness 0.35 μm made from a chemically amplified positive photoresist. Halftone phase masks with 6% transmission that had the line pattern illustrated in the first row of FIG. 4 were produced for the first exposure. The exposure of the photoresist was performed with the aid of an exposure unit that had a numerical aperture NA of 0.7 in conjunction with a wavelength λ of 193 nm and an annularity σ=0.56/0.85. The photoresist was subsequently heated in a PEB step. The wafer was subsequently arranged in a second exposure unit, which had a numerical aperture NA of 0.63. A COG photomask was arranged in the beam path. The mask had the line pattern illustrated in the second row of FIG. 4. Subsequently, the wafer was heated in a second PEB step and then developed with the aid of an alkali developer.

The following tests were also simulated analogously with the aid of the same first and second photomasks shown in FIG. 4, the exposure conditions being specified in the following Table 1.

TABLE 1

Conditions for first and second exposure

| First exposure | | Second exposure | |
|---|---|---|---|
| NA | λ (nm) | NA | λ (nm) |
| 0.70 | 193 | 0.63 | 248 |
| 0.70 | 193 | 0.60 | 193 |
| 0.80 | 157 | 0.70 | 248 |
| 0.30 | 13 | 0.70 | 193 |
| 0.73 | 248 | 0.60 | 248 |

Three variants of the tests were carried out in each case. In the first variant, the second exposure was carried out directly after the first exposure. In the second variant, after the first exposure a PEB step was carried out, followed by the second exposure. In the third step, finally, after the first exposure a PEB step was carried out, followed by the development of the photoresist with the aid of the developer. The second exposure step was performed after the development.

The commercial advantage of the method according to the invention consists in that smaller structures can be implemented without the need to prohibit zones in the design. This holds both for logic circuits and for DRAM circuits. Moreover, in the case of the second exposure, it is possible to use less expensive exposure units, for example steppers with a lower resolution in conjunction with the same wavelength, or else with a longer wavelength.

We claim:

1. A method of structuring a photoresist, which comprises:
providing a photoresist for at least a semidense structure on a substrate;
performing a first exposure by exposing the photoresist with a first photomask imaging a principal structure and an imaging auxiliary structure, for improved imaging of the principal structure, onto the photoresist to thereby cause a chemical differentiation of the photoresist between exposed and unexposed regions; and
subsequently performing a second exposure with a second photomask imaging the imaging auxiliary structure on the photoresist but not imaging the principal structure on the photoresist to thereby cause a chemical modification of the photoresist only in imaged portions of the imaging auxiliary structure; and
developing the photoresist with a developer such that only the principal structure is retained on the substrate.

2. The method according to claim 1, which comprises carrying out the first exposure and the second exposure under mutually different conditions.

3. The method according to claim 2, which comprises fashioning the mutually different conditions by carrying out the first exposure with a first exposure device and carrying out the second exposure with a second exposure device having a different numerical aperture than the second exposure device.

4. The method according to claim 3, wherein the first exposure device has a greater numerical aperture than the second exposure device.

5. The method according to claim 2, which comprises fashioning the mutually different conditions by carrying out the first exposure with exposure radiation having a wavelength different from an exposure radiation of the second exposure.

6. The method according to claim 5, wherein the radiation used for the first exposure has a shorter wavelength than the radiation used for the second exposure.

7. The method according to claim 2, wherein the first photomask and the second photomask are masks of a different mask type.

8. The method according to claim 7, wherein the mask type is selected from the group consisting of chrome masks, halftone phase shift masks, and alternating phase shift masks.

9. The method according to claim 1, which comprises performing a baking step after the first exposure, and subsequently carrying out the second exposure.

10. The method according to claim 1, which comprises, after the first exposure, performing an intermediate development of the photoresist with a developer such that the principal structure and the auxiliary structure remain on the substrate.

11. A method of structuring a photoresist, which comprises:
providing a photoresist for at least a semidense structure on a substrate;
performing a first exposure by exposing the photoresist with a first photomask imaging a principal structure and an imaging auxiliary structure, for improved imaging of the principal structure, onto the photoresist to thereby cause a chemical differentiation of the photoresist between exposed and unexposed regions; and
subsequently performing a second exposure by exposing the photoresist with a second photomask imaging the imaging auxiliary structure on the photoresist but not substantially imaging the principal structure on the photoresist, to thereby cause a chemical modification of the photoresist only in imaged portions of the imaging auxiliary structure; and developing the photoresist to develop only the principal structure on the substrate.

12. The method according to claim 11, which comprises carrying out the first exposure and the second exposure under mutually different conditions.

* * * * *